United States Patent [19]
Takahashi et al.

[11] Patent Number: 6,008,885
[45] Date of Patent: Dec. 28, 1999

[54] SCANNING EXPOSURE APPARATUS

[75] Inventors: Kazuhiro Takahashi; Kazunori Iwamoto, both of Utsunomiya, Japan

[73] Assignee: Canon Kabushiki Kaisha, Tokyo, Japan

[21] Appl. No.: 08/941,629

[22] Filed: Sep. 29, 1997

[30] Foreign Application Priority Data

Oct. 2, 1996 [JP] Japan ..................................... 8-279854

[51] Int. Cl.⁶ ............................. G03B 27/54; G03B 27/42
[52] U.S. Cl. ................................................. 355/67; 355/53
[58] Field of Search ................................. 355/53, 57, 67, 355/71, 72, 66

[56] References Cited

U.S. PATENT DOCUMENTS

| | | | |
|---|---|---|---|
| 4,583,840 | 4/1986 | Yabu et al. | 355/53 |
| 4,724,466 | 2/1988 | Ogawa et al. | 355/53 |
| 5,128,975 | 7/1992 | Iwamoto et al. | 378/34 |
| 5,194,893 | 3/1993 | Nishi | 355/53 |
| 5,204,711 | 4/1993 | Takubo et al. | 355/53 |
| 5,281,996 | 1/1994 | Bruning et al. | 355/77 |
| 5,467,720 | 11/1995 | Korenaga et al. | 108/20 |
| 5,508,518 | 4/1996 | Kendall | 250/492.2 |
| 5,574,537 | 11/1996 | Ozawa | 355/71 |
| 5,706,076 | 1/1998 | Takeda | 355/53 |
| 5,721,606 | 2/1998 | Jain | 355/53 |
| 5,739,899 | 4/1998 | Nishi et al. | 355/53 |
| 5,742,376 | 4/1998 | Makinouchi | 355/53 |
| 5,798,838 | 8/1998 | Taniguchi et al. | 356/401 |

FOREIGN PATENT DOCUMENTS 2 299 867 10/1996 United Kingdom.
WO 86/00427 1/1986 WIPO.

*Primary Examiner*—Alan A. Mathews
*Attorney, Agent, or Firm*—Fitzpatrick, Cella, Harper & Scinto

[57] ABSTRACT

A scanning exposure apparatus includes a light source, an illumination optical system for forming a secondary light source with light from the light source, and for illuminating a portion of a reticle having a pattern, a projection optical system for projecting the pattern of the reticle as illuminated, onto a wafer, a reticle stage for supporting the reticle and for scanningly moving the reticle in a predetermined scan direction, relative to the projection optical system, a wafer stage for supporting the wafer and for scanningly moving the wafer relative to the projection optical system, and a base for supporting the reticle stage and being supported by dampers, wherein the illumination optical system is divided into a first portion being supported by the base and a second portion supported by a floor, independently from the base, and wherein the predetermined direction of the reticle stage is substantially or approximately parallel to an optical axis direction at a location where the illumination optical system is divided.

30 Claims, 5 Drawing Sheets

SCANNING EXPOSURE APPARATUS

FIELD OF THE INVENTION AND RELATED ART

This invention relates to an exposure apparatus usable in the manufacture of semiconductor devices, for printing by exposure a design pattern onto a resist provided on a substrate, and also to a device manufacturing method which uses such an exposure apparatus.

As regards exposure apparatuses, there is a stepper in which a mask pattern is projected by a projection optical system onto different exposure regions on a substrate such as a wafer, sequentially, while moving the substrate stepwise. Also, there is a scan type exposure apparatus wherein a mask and a substrate are moved relative to a projection optical system so that the mask and the substrate are scanned with slit-like exposure light, whereby the mask pattern is scanningly printed on the substrate.

Further, a step-and-scan type exposure apparatus has been proposed, in an attempt to enable fine pattern printing with higher precision. In such an apparatus, the stepwise motion and scan exposure such as described above are repeated, by which high precision fine pattern printing is performed to plural regions on a substrate. In this type of exposure apparatus, a slit is used so that only a portion relatively near the optical axis of a projection optical system can be used limitedly. This enables higher precision printing of the fine pattern.

In scanning exposure apparatuses, however, if an excimer laser is used as a light source, an illumination optical system has to be enlarged because beam shaping or incoherency transformation is necessary. Also, if the light source comprises a lamp, bulkiness of the light source causes enlargement of the illumination optical system. There is an additional factor of an enlarged illumination optical system: that is, the illumination optical system is complicated because it is necessary to meet modified illumination.

When such an enlarged illumination optical system is mounted on a main structure of an exposure apparatus, being supported by an anti-vibration table, the position of the center of gravity will shift due to the weight of the illumination optical system. This adversely affects a sufficient anti-vibration effect. In order to assure the anti-vibration effect, the main structure itself has to be enlarged.

When the whole illumination optical system is placed on the floor, there is another problem that, due to displacement of the main structure to be caused by the scan operation of a mask stage and a substrate stage, a relative change occurs between the illumination position and the mask.

SUMMARY OF THE INVENTION

It is an object of the present invention to provide an improved scanning exposure apparatus by which the effect of displacement of a main structure of an exposure apparatus with the scan operation of a mask stage can be reduced or avoided without enlargement of the main structure, such that exposure precision can be improved with a simple and compact structure.

In accordance with an aspect of the present invention, there is provided a scanning exposure apparatus, comprising: a light source; an illumination optical system for forming a secondary light source with light from said light source, and for illuminating a portion of a reticle having a pattern; a projection optical system for projecting the pattern of the reticle as illuminated, onto a wafer; a reticle stage for supporting the reticle and for scanningly moving the reticle in a predetermined scan direction, relative to said projection optical system; a wafer stage for supporting the wafer and for scanningly moving the wafer relative to said projection optical system; and a base for supporting said reticle stage and being supported by damper means; wherein said illumination optical system is divided into a first portion being supported by said base and a second portion supported by a floor, independently from said base; and wherein said predetermined direction of said reticle stage is substantially or approximately parallel to an optical axis direction at a location where said illumination optical system is divided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described with reference to the drawings.

Figure 1:
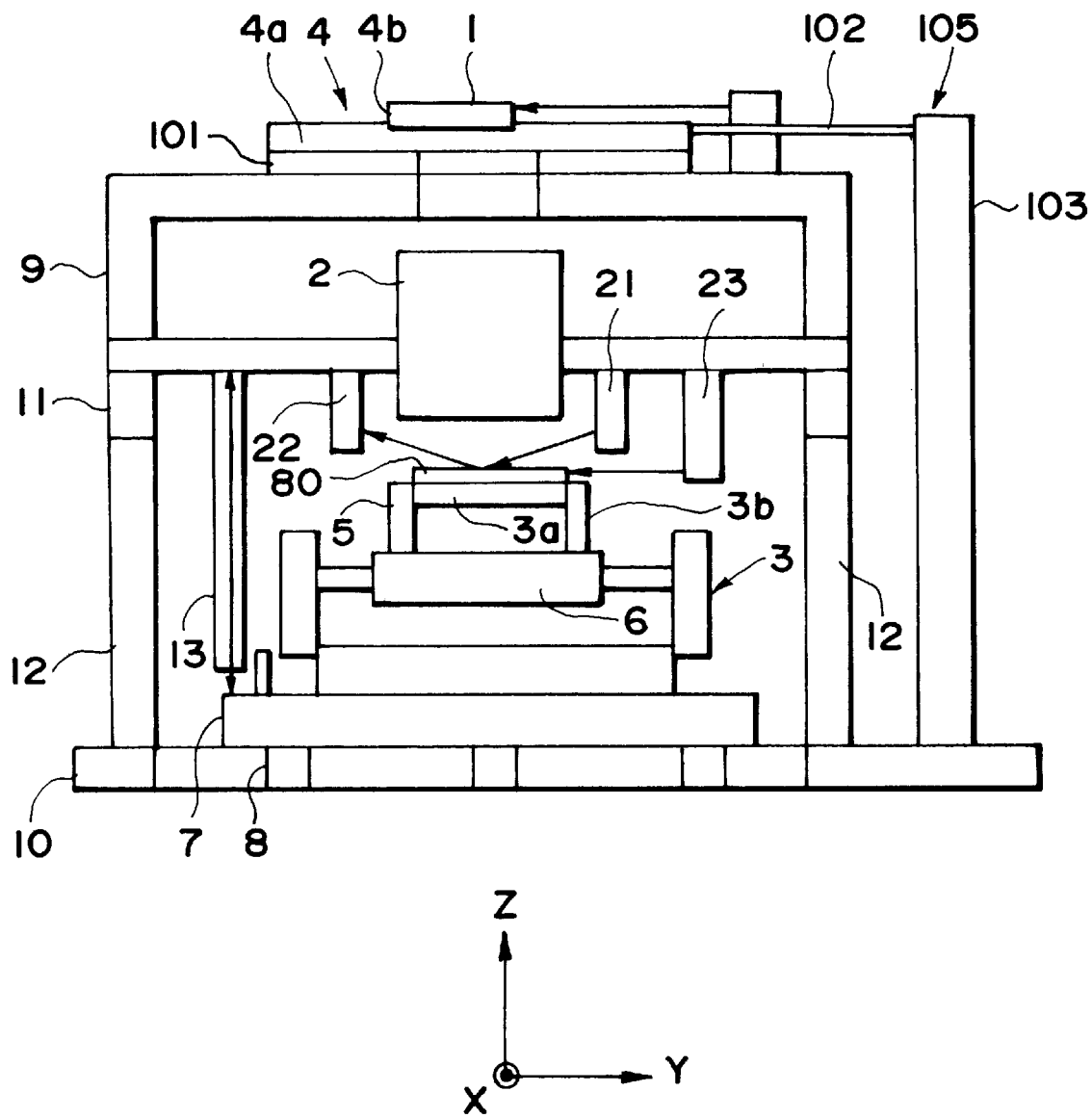
FIG. 1 is a schematic and side view of an exposure apparatus according to an embodiment of the present invention.
Figure 2:
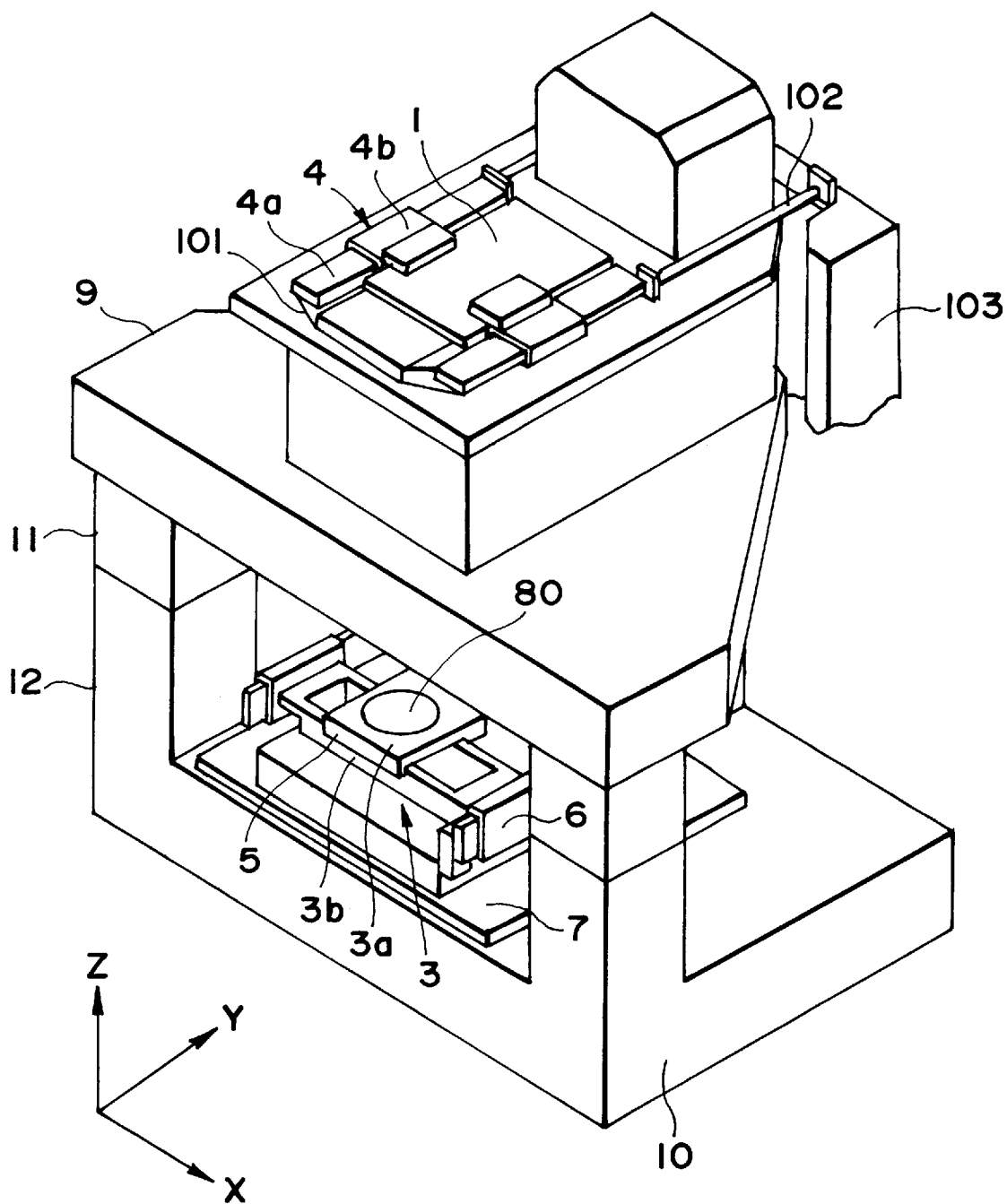
FIG. 2 is a schematic and perspective view of the exposure apparatus of FIG. 1.

FIG. 1 is a schematic view of an exposure apparatus according to an embodiment of the present invention, as seen from the side. FIG. 2 is a perspective view of this exposure apparatus. As seen in these drawings, the exposure apparatus comprises a step-and-scan type exposure apparatus wherein a portion of a pattern of a reticle is projected by a projection optical system 2 onto a wafer placed on a fine-motion stage mechanism 80, mounted on an X-Y stage mechanism 3, wherein the reticle and the wafer are relatively and scanningly moved in synchronism with each other in the Y direction relative to the projection optical system 2, whereby the pattern of the reticle is transferred to the wafer, and wherein there is stepwise motion interposed to repeat the scan exposure to plural regions on the wafer.

Motion of the reticle in the scan direction (Y direction) is provided by a reticle side stage mechanism having a linear motor 4 wherein a thrust is produced between a stator 4a and a movable element 4b by which the movable element 4b can be moved in the scan direction. The reticle stage 1 is connected to this movable element 4b. The stator 4a is supported by first supporting means 101, with a freedom in the Y direction. Also, it is supported by second supporting means 105, rigidly in the Y direction and flexibly in other directions. The second supporting means 105 includes a pillar 103 extending upwardly from a base frame 10, and one-axis supporting means 102 extending in the Y direction from the pillar 103 and for supporting the stator 4a rigidly in Y direction and flexibly in the other directions.

The reticle stage 1 can be moved in the Y direction by the linear motor 4. The X-Y stage mechanism 3 comprises an X stage 3a which can be moved in the X direction by a linear motor 5. The wafer stage further comprises a Y stage 3b which can be moved in the Y direction by a linear motor 6. A synchronized scan of the reticle and the wafer is provided by moving the reticle stage 1 and the Y stage 3b in the Y direction at a predetermined speed ratio (e.g., 4:1). Stepwise motion in the X direction is provided by the X stage 3a.

The X-Y stage 3 is mounted on a stage base 7 which is supported by the floor, for example, at three points and through three dampers 8. The first supporting means 101 and the projection optical system 2 are mounted on a barrel base 9 which is supported by the base frame 10 through three dampers 11 and pillars 12. Each damper 8 comprises an active damper for active vibration control or vibration isolation in six-axis directions. However, it may comprise a passive damper. Alternatively, the mechanism may be supported without such a damper.

In operation with the structure described above, by use of conveying means (not shown), a wafer is conveyed along a conveyance path between two pillars 12 in the front portion of the apparatus, onto the X-Y stage 3. After completion of a predetermined alignment operation, the exposure apparatus performs printing of the pattern of the reticle onto plural exposure regions on the wafer while repeating scan exposure and stepwise motion. With regard to the scan exposure, the reticle stage 1 and the Y stage 3b are moved in the Y direction (scan direction) at a predetermined speed ratio so that the pattern of the reticle is scanned with slit-like exposure light, and also, the wafer is scanned with the projected image thereof. By this, the pattern of the reticle is transferred and printed onto a particular exposure region on the wafer. After scan exposure of one exposure region is completed, the X stage 3a is driven in the X direction to move the wafer stepwise to thereby place another exposure region at the scan exposure start position. Then, the scan exposure is performed. The layout of exposure regions, the scan direction (positive or negative) and the order of exposures for the exposure regions, for example, are so determined that, with the combination of stepwise motion in the X direction and movement in the Y direction for scan exposure, the exposures can be done efficiently to plural exposure regions on the wafer.

Figure 3:
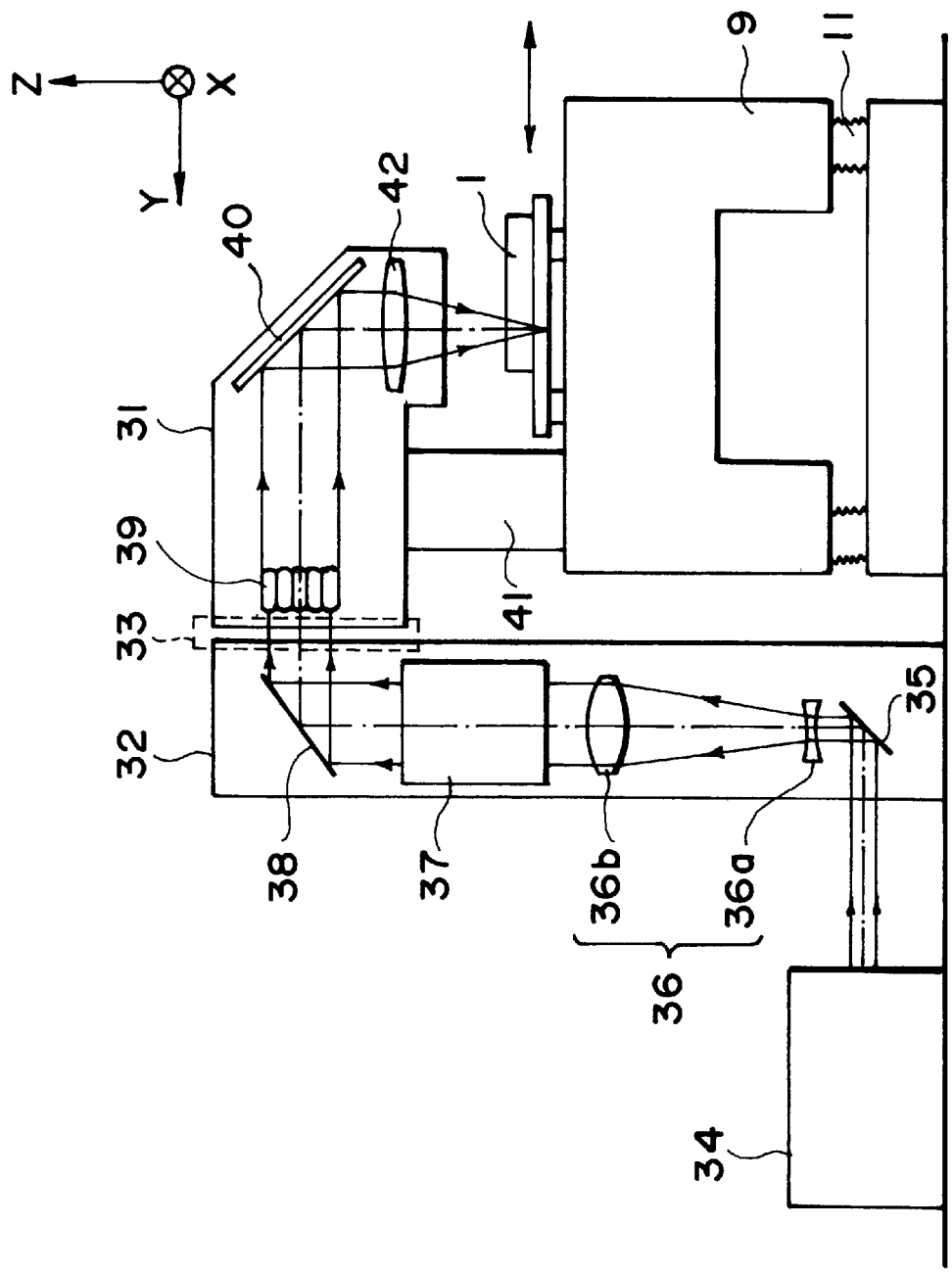
FIG. 3 is a schematic view of an illumination optical system which can be incorporated into the exposure apparatus of FIGS. 1 and 2.

FIG. 3 is a schematic view of the structure of an illumination optical system which can be incorporated into the exposure apparatus of FIGS. 1 and 2. The projection optical system (not shown) and the reticle stage 1 are mounted on a barrel base (main structure) 9 which is supported by dampers. On the other hand, the illumination optical system is divided into a main portion (first portion) 31 fixedly supported by the barrel base 9 through a support table 41, and a floor-supported portion (second portion) 32 directly disposed on the floor. The direction of displacement of the barrel base 9 which depends on the position of the reticle stage 1 during the scan is included in a plane which contains the optical axis direction, at the portion 33 where the illumination optical system is divided, and a direction corresponding to the scan direction (Y direction). Here, the direction corresponding to the scan direction means a direction in which, when the optical axis of the illumination light shifts on the reticle in the scan direction, the optical axis at the division portion 33 shifts. In this example, it is the Z direction. Thus, the direction of displacement of the barrel base 9 lies on the Y-Z plane.

The floor-supported portion 32 includes a mirror 35 for reflecting, upwardly, a beam of pulsed light as emitted horizontally from an excimer laser (light source) 34, a beam shaping optical system 36 for adjusting the shape of the beam from the mirror 35, incoherency transformation means 37 for transforming the shaped beam into coherent light, by dividing and deflecting it with time, for example, and a mirror 38 for reflecting the light from the incoherency transformation means 37 toward the main portion 31 (in the Y direction). The beam shaping optical system 36 comprises a concave lens 36a for diverging the beam from the mirror 35, and a convex lens 36b for transforming the divergent beam from the concave lens 36a into parallel light.

The main portion 31 comprises a fly's eye lens 39 for receiving the light from the mirror 38 of the floor-supported portion 32 and for forming secondary light sources, a mirror 40 for reflecting downwardly (Z direction) the light emitted in the Y direction from the fly's eye lens 39, and a condensing lens 42 for collecting the light from the mirror 40 and for illuminating a predetermined range of the reticle which is placed on the reticle stage 1. While not shown in the drawing, the main portion 31 further includes a masking blade for shaping the illumination light into a slit-like shape in the X direction.

During the scan exposure, as the reticle stage 1 moves in the scan direction (Y direction), the barrel base 9 displaces along the Y-Z plane due to a shift of the center of gravity thereof. As a result of this, the relative position between the main portion 31 and the floor-supported portion 32 of the illumination optical system changes. Such relative displacement occurs in the Y-Z plane, but the displacement in the Y direction corresponds, in the sense of optics, to a change in distance between the mirror 38 and the fly's eye lens 39. It does not cause a change in symmetry of the beam entering the fly's eye lens 39. Therefore, with the displacement component in the Y direction, there occurs no change in the illuminance distribution, within the illumination region upon the reticle.

On the other hand, displacement in the Z direction causes a change in position of the beam entering the fly's eye lens 39, in the Z direction. Thus, it produces non-uniform illuminance, which is asymmetric with respect to the Y direction, i.e., to the scan direction. Since, however, in scan exposure, there occurs no dispersion of the exposure amount unless, in the illumination region, the distribution of light quantity as integrated in the scan direction changes. Thus, with the displacement component in the Z direction, the distribution of the exposure amount does not become non-uniform.

As a consequence, even if the barrel base 9 tilts, the motion of the reticle stage 1 in the scan direction provides scan exposure with a uniform exposure amount distribution.

Also, since the fly's eye lens 39 is fixedly supported by the main portion which is fixedly held by the barrel base 9, the relative position of the optical axis of the illumination light after the fly's eye lens 39 with respect to the barrel base 9 is kept constant, continuously. Therefore, regardless of any tilt of the barrel base 9, the position of the illumination region upon the reticle is held constant, continuously.

Next, an embodiment of a device manufacturing method which uses an exposure apparatus such as described above, will be explained.

Figure 4:
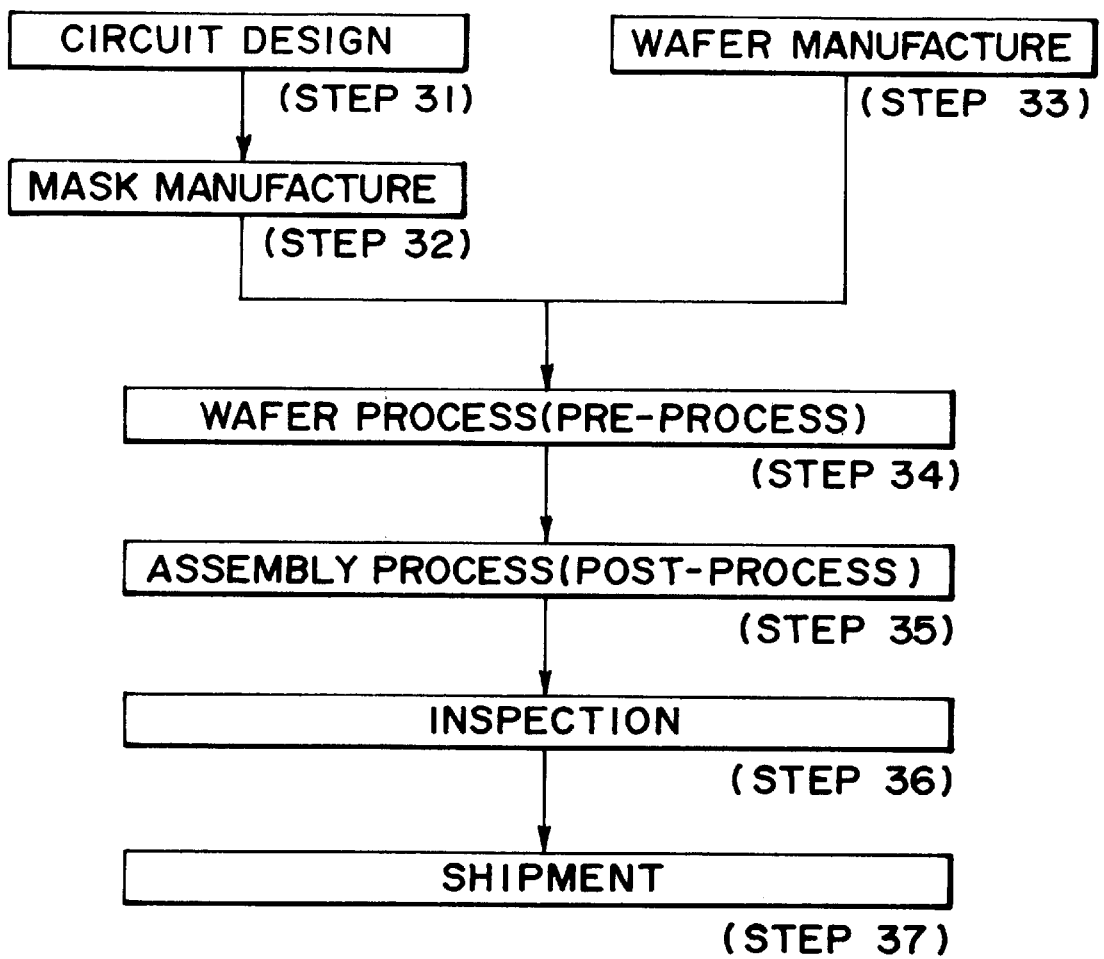
FIG. 4 is a flow chart of the procedure for the manufacture of microdevices, by use of the exposure apparatus of FIG. 1.

FIG. 4 is a flow chart of the procedure for the manufacture of microdevices such as semiconductor chips (e.g., ICs or LSIs), liquid crystal panels, CCDs, thin film magnetic heads or micro-machines, for example. Step 31 is a design process for designing a circuit of a semiconductor device. Step 32 is a process for making a mask on the basis of the circuit pattern design. Step 33 is a process for preparing a wafer by using a material such as silicon. Step 34 is a wafer process which is called a pre-process wherein, by using the so prepared mask and wafer, circuits are practically formed on the wafer through lithography. Step 35, subsequent to this, is an assembling step which is called a post-process wherein the wafer having been processed by step 34 is formed into semiconductor chips. This step includes an assembling (dicing and bonding) process and a packaging (chip sealing) process. Step 36 is an inspection step wherein an operation check, a durability check and so on for the semiconductor devices provided by step 35, are carried out. With these processes, semiconductor devices are completed and they are shipped (step 37).

Figure 5:
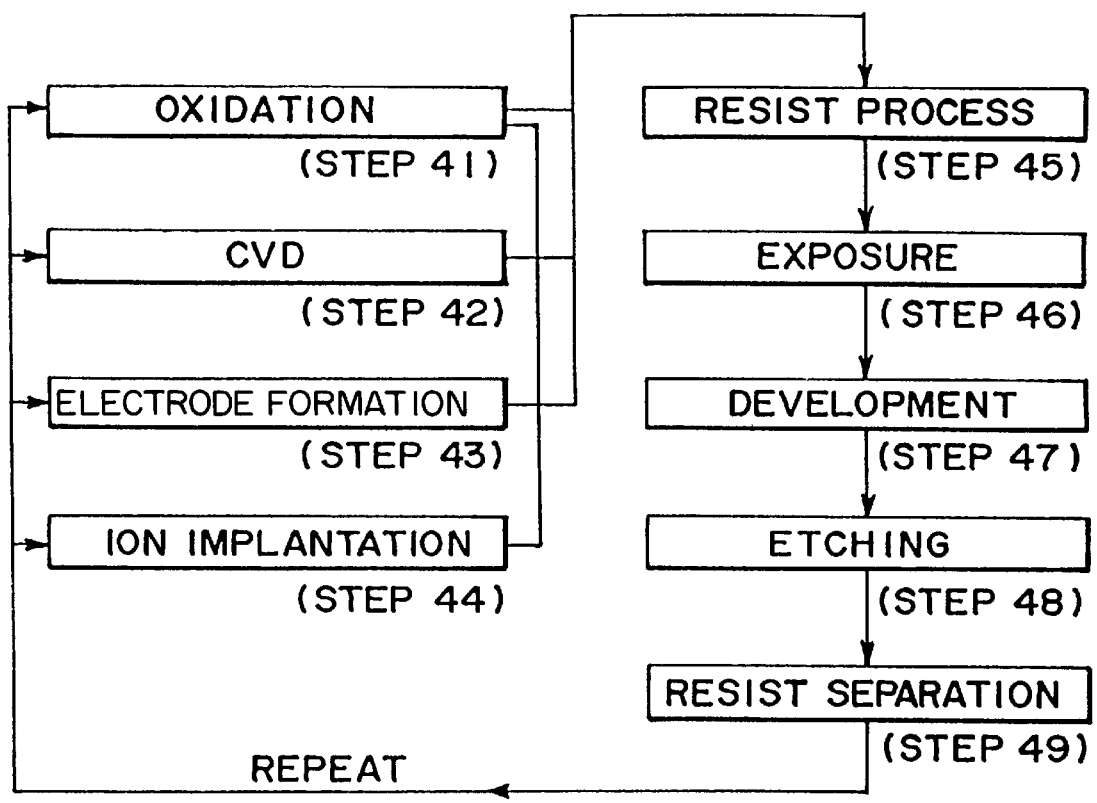
FIG. 5 is a flow chart for explaining details of a wafer process, included in the procedure of FIG. 4.

FIG. 5 is a flow chart showing details of the wafer process. Step 41 is an oxidation process for oxidizing the surface of a wafer. Step 42 is a CVD process for forming an insulating film on the wafer surface. Step 43 is an electrode forming process for forming electrodes upon the wafer by vapor deposition. Step 44 is an ion implanting process for implanting ions to the wafer. Step 45 is a resist process for applying a resist (photosensitive material) to the wafer. Step 46 is an exposure process for printing, by exposure, the circuit pattern of the mask on the wafer through the exposure apparatus described above. Step 47 is a developing process for developing the exposed wafer. Step 48 is an etching process for removing portions other than the developed resist image. Step 49 is a resist separation process for separating the resist material remaining on the wafer after being subjected to the etching process. By repeating these processes, circuit patterns are superposedly formed on the wafer.

With these processes, high density microdevices can be manufactured.

In accordance with these embodiments of the present invention, as described above, the illumination optical system is divided into a main portion being disposed on a main structure and a floor-supported portion being directly disposed on a floor. This assures that the direction of displacement of the main structure which depends on the position of a mask stage during the scan is laid within a plane which includes the optical axis direction, at the location where the illumination optical system is divided, and a direction corresponding to the scan direction. As a result, scan exposure with a uniform exposure amount distribution is enabled.

Further, since a secondary light source forming means for providing light as a secondary light source is disposed on the main portion of the illumination optical system, the position of the illumination region on the reticle can be held constant, continuously. This enables scan exposure with a more uniform exposure amount distribution.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus, comprising:
   a light source for emitting light;
   an illumination optical system for forming a secondary light source with light emitted from said light source, and for illuminating a portion of a reticle having a pattern;
   a projection optical system for projecting the pattern of the reticle, as illuminated, onto a wafer;
   a reticle stage for supporting the reticle and for scanningly moving the reticle in a predetermined scan direction, relative to said projection optical system;
   a wafer stage for supporting the wafer and for scanningly moving the wafer relative to said projection optical system; and
   a base for supporting said reticle stage and being supported by damper means,
   wherein said illumination optical system is divided into a first portion being supported by said base and a second portion supported by a floor, independently from said base, and the predetermined direction of said reticle stage is substantially or approximately parallel to an optical axis direction at a location where said illumination optical system is divided.

2. An apparatus according to claim 1, wherein the first portion of said illumination optical system is displaceable in a particular direction with scan motion of said reticle stage, and the particular direction is included in a plane which is defined by the optical axis direction at the location where said illumination optical system is divided and a direction of incidence of illumination light, impinging on the reticle.

3. An apparatus according to claim 1, wherein said illumination optical system includes a fly's eye lens for forming the secondary light source, and said illumination optical system is divided into the first and second portions, in a portion of a light path from said light source and before said fly's eye lens.

4. An apparatus according to claim 3, wherein the second portion of said illumination optical system includes a beam shaping optical system for adjusting the shape of a beam, an incoherency transformation optical system for providing incoherent light, and a reflection mirror for reflecting a beam to direct it toward said fly's eye lens.

5. An apparatus according to claim 1, wherein said base supports said projection optical system as well as said reticle stage.

6. An apparatus according to claim 1, wherein said light source is placed on the floor.

7. An apparatus according to claim 6, wherein said light source comprises an excimer laser.

8. An apparatus according to claim 1, wherein said reticle stage and said wafer stage are scanned in a timed relation, at a speed ratio corresponding to a magnification of said projection optical system.

9. An apparatus according to claim 1, wherein said reticle stage is movable stepwise, with the scan motion in the predetermined direction, in a direction perpendicular to the predetermined direction.

10. A device manufacturing method for producing a device, said method comprising:
    providing a light source for emitting light;
    forming, with an illumination optical system, a secondary light source with light emitted from the light source, and illuminating a portion of a reticle having a pattern;
    projecting, with a projection optical system, the pattern of the reticle, as illuminated, onto a wafer to produce a device;
    supporting, by a reticle stage, the reticle, and scanningly moving the reticle in a predetermined scan direction, relative to the projection optical system;
    supporting, by a wafer stage, the wafer, and scanningly moving the wafer relative to the projection optical system; and
    supporting, by a base, the reticle stage, the base being supported by damper means,
    wherein the illumination optical system is divided into a first portion being supported by the base and a second portion supported by a floor, independently from the base, and the predetermined direction of the reticle stage is substantially or approximately parallel to an optical axis direction at a location where the illumination optical system is divided.

11. A method according to claim 10, further comprising displacing the first portion of the illumination optical system in a particular direction with scan motion of the reticle stage, wherein the particular direction is included in a plane which is defined by the optical axis direction at the location where the illumination optical system is divided and a direction of incidence of illumination light, impinging on the reticle.

12. A method according to claim 10, wherein the illumination optical system includes a fly's eye lens for forming the secondary light source, and the illumination optical system is divided into the first and second portions, in a portion of a light path from the light source and before the fly's eye lens.

13. A method according to claim 12, wherein the second portion of the illumination optical system includes a beam shaping optical system for adjusting the shape of a beam, an incoherency transformation optical system for providing incoherent light, and a reflection mirror for reflecting a beam to direct it toward the fly's eye lens.

14. A method according to claim 10, further comprising supporting the projection optical system as well as the reticle stage by the base.

15. A method according to claim 10, further comprising placing the light source on the floor.

16. A method according to claim 15, wherein the light source comprises an excimer laser.

17. A method according to claim 10, further comprising scanning the reticle stage and the wafer stage in a timed relation, at a speed ratio corresponding to a magnification of the projection optical system.

18. A method according to claim 10, further comprising moving the reticle stage stepwise, with the scan motion in the predetermined direction, in a direction perpendicular to the predetermined direction.

19. A scanning exposure apparatus, comprising:
an illumination optical system for illuminating a reticle having a pattern;
a reticle stage for supporting the reticle and for moving the reticle in a predetermined scan direction;
a base for supporting said reticle stage; and
damper means for supporting said base,
wherein said illumination optical system is divided into a first portion, which is supported by said base, and a second portion, which is independent from said base, and the scan direction is substantially parallel to an optical axis direction at a location where said illumination optical system is divided.

20. An apparatus according to claim 19, wherein the first portion of said illumination optical system is displaceable in a particular direction with scan motion of said reticle stage, and the particular direction is included in a plane which is defined by the optical axis direction at the location where said illumination optical system is divided and a direction of incidence of illumination light, impinging on the reticle.

21. An apparatus according to claim 19, wherein said illumination optical system includes a fly's eye lens for forming a secondary light source, and said illumination optical system is divided into the first and second portions, in a portion of a light path from said light source and before said fly's eye lens.

22. An apparatus according to claim 21, wherein the second portion of said illumination optical system includes a beam shaping optical system for adjusting the shape of a beam, an incoherency transformation optical system for providing incoherent light, and a reflection mirror for reflecting a beam to direct it toward said fly's eye lens.

23. An apparatus according to claim 19, wherein said base supports said projection optical system as well as said reticle stage.

24. An apparatus according to claim 19, further comprising a light source, which is placed on the floor.

25. An apparatus according to claim 24, wherein said light source comprises an excimer laser.

26. An apparatus according to claim 19, wherein said reticle stage and a wafer stage are scanned in a timed relation, at a speed ratio corresponding to a magnification of a projection optical system.

27. An apparatus according to claim 19, wherein said reticle stage is movable stepwise, with the scan motion in the predetermined direction, in a direction perpendicular to the predetermined direction.

28. A device manufacturing method for producing a device, said method comprising:
illuminating a reticle having a pattern with an illumination optical system;
projecting, with a projection optical system, the pattern of the reticle, as illuminated, onto a wafer to produce a device;
supporting, by a reticle stage, the reticle and moving the reticle in a predetermined scan direction;
supporting the reticle stage by a base; and
supporting the base by damper means,
wherein the illumination optical system is divided into a first portion, which is supported by the base and a second portion, which is independent from the base, and the scan direction is substantially parallel to an optical axis direction at a location where the illumination optical system is divided.

29. A scanning exposure apparatus, comprising:
an illumination optical system for illuminating a portion of a reticle having a pattern;
a projection otical system;
a reticle stage for supporting the reticle and for moving the reticle in a predetermined scan direction, relative to said projection optical system;
a base for supporting said reticle stage; and
damper means for supporting said base,
wherein at least a portion of said illumination optical system is supported by said base, and light is projected substantially parallel to the scan direction to the portion of said illumination optical system, which is supported by said base.

30. A device manufacturing method for producing a device, said method comprising:
illuminating a portion of a reticle having a pattern with an illumination optical system;
projecting, with a projection optical system, the pattern of the reticle, as illuminated, onto a wafer to produce a device;
supporting, by a reticle stage, the reticle and moving the retilce in a predetermined scan direction, relative to the projection optical system;
supporting the reticle stage by a base; and
supporting the base by damper means,
wherein at least a portion of the illumination optical system is supported by the base, and light is projected substantially parallel to the scan direction to the portion of the illumination optical system, which is supported by the base.

* * * * *